US007528619B2

United States Patent

(12) United States Patent
Paillet et al.

(10) Patent No.: US 7,528,619 B2
(45) Date of Patent: May 5, 2009

(54) 0TH DROOP DETECTOR ARCHITECTURE AND IMPLEMENTATION

(75) Inventors: Fabrice Paillet, Hillsboro, OR (US); Tanay Karnik, Portland, OR (US); Jianping Xu, Portland, OR (US); Vivek K. De, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 803 days.

(21) Appl. No.: 11/172,250

(22) Filed: Jun. 30, 2005

(65) Prior Publication Data

US 2007/0013414 A1 Jan. 18, 2007

(51) Int. Cl.
*G01R 31/00* (2006.01)
*G01R 19/00* (2006.01)

(52) U.S. Cl. ........................... 324/765; 702/64; 326/28

(58) Field of Classification Search ................ 324/765, 324/768–769; 702/57, 60, 64–65; 326/21, 326/26–28; 327/50, 206–208, 210–212, 327/162, 291, 298; 323/282, 285
See application file for complete search history.

(56) References Cited

U.S. PATENT DOCUMENTS 4,641,246 A * 2/1987 Halbert et al. .............. 341/163
5,463,648 A * 10/1995 Gibbs ...................... 372/38.02
7,042,259 B2 * 5/2006 Kurd et al. .................. 327/147
7,133,751 B2 * 11/2006 Kurd et al. .................. 700/293
7,170,267 B1 * 1/2007 McJimsey ................... 323/271
7,225,349 B2 * 5/2007 Tam et al. ................... 713/322

* cited by examiner

*Primary Examiner*—Bot LeDynh
(74) *Attorney, Agent, or Firm*—Carrie A. Boone, P.C.

(57) ABSTRACT

A voltage droop detector captures the very high-frequency noise on the power grid of a load, such as a microprocessor. The droop detector includes twin circuits, one of which receives the voltage from the power grid of the load, the other of which receives a filtered voltage. A $0^{th}$ droop, as well as $1^{st}$ droops, $2^{nd}$ droops, and so on, are captured and stored for subsequent analysis. The circuits sample the voltages frequently enough to ensure that all droop events are captured. Other embodiments are described and claimed.

11 Claims, 8 Drawing Sheets

100
14
R
C
$V_{filt}$
$V_{cc}$
10
0th droop detector (β)
10
0th droop detector (α)
clock (16)
18
n
n
FIFO (12)
1st droop event (20B)
non-droop event (20C)
0th droop event (20A)

10
n
$out_{30A}$
$out_{30B}$
$out_{30C}$
$out_{30D}$
sampler (30A)
sampler (30B)
sampler (30C)
sampler (30D)
$clk_{30A}$
$clk_{30B}$
$clk_{30C}$
$clk_{30D}$
Δt
Δt
Δt
22A
22B
22C
$V_{samp}$
$V_{ref}$
clock (16)

30
36
d#
d
clk
clk#
q#
q
$out_{i\#}$
$out_i$
24C
24D
$out_{28B1}$
$out_{28B2}$
28B
$out_1$
$out_2$
clk
$V_{dd}$
$V_{in}$
$V_{ref}$
$clk_{i\#}$
24B
24A
$out_{28A1}$
$out_{28A2}$
28A
$out_1$
$out_2$
clk
$V_{dd}$
$V_{in}$
$V_{ref}$
$V_{samp}$
$V_{ref}$
$clk_i$ clk$_{i\#}$
clk$_i$
24Q
24R
d#
72A
24E
24F
72C
24G
24H
q#
d
72B
24J
24M
72D
24N
24P
q

0TH DROOP DETECTOR ARCHITECTURE AND IMPLEMENTATION

FIELD OF THE INVENTION

This invention relates to voltage detection circuitry and, more particularly, to a circuit and method for detecting a $0^{th}$ droop in a system.

BACKGROUND OF THE INVENTION

Power-based systems are designed to address changes in current requirements at the load. A microprocessor load, for example, may change its current consumption by 50 amps or more in a fraction of a nanosecond, or a single cycle. This current spike, or change in current consumption (di/dt) causes voltage variations or spikes, known as droops, on the power supply. A droop is defined as an output voltage change as a function of time, and may include both under-voltage and over-voltage conditions.

These droops are designated as $0^{th}$ order, $1^{st}$ order, $2^{nd}$ order, and so on, according to their duration. A $0^{th}$ order voltage droop, or $0^{th}$ droop, manifests itself as a high-frequency noise on the power grid of the load. The $0^{th}$ droop is the first droop to manifest in a voltage spike event (as compared to the $1^{st}$ droop, $2^{nd}$ droop, etc.), and has a very short duration.

The duration of the $0^{th}$ droop is so short, in fact, that the $0^{th}$ droop is undetectable using known technology. The $0^{th}$ droop has not yet been successfully quantified due to its very high frequency (10 GHz and above) compared to the $1^{st}$ droop (below 1 GHz). Further, for microprocessors, the available technology has been unable to accurately measure the $0^{th}$ droop from outside the chip. The droop component is expected to be local and the result of a large di/dt, combined with the on-die inductance and capacitance of the power grid.

Analog droop detectors work by amplifying the droop signal so that the signal has a large enough amplitude to be detectable. The problem with these droop detectors is that, for a droop event of a very short duration (a very narrow droop), such as a $0^{th}$ droop event, the amplifier must have a very high bandwidth in order to sufficiently amplify the signal for it to be detectable. High-bandwidth amplifiers are very difficult to make. Thus, droop detectors are either very fast, but not very sensitive, or very sensitive, but not very fast. In either case, a $0^{th}$ droop event will be missed.

Because the $0^{th}$ droop has not been measure with precision, engineers have been unable to ascertain either the amplitude or the quantitative impact of a $0^{th}$ droop event on a microprocessor.

Thus, there is a continuing need for a droop detector that overcomes the shortcomings of the prior art.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein like reference numerals refer to like parts throughout the various views, unless otherwise specified.

DETAILED DESCRIPTION

In accordance with the embodiments described herein, a voltage droop detector is disclosed for capturing the very high-frequency noise on the power grid of a load, such as a microprocessor. The droop detector includes twin circuits, one of which receives the voltage from the power grid of the load, the other of which receives a filtered voltage. A droop detected by the first circuit but not the second circuit, deemed the $0^{th}$ droop, as well as $1^{st}$ droop, $2^{nd}$ droop, and so on, are captured and stored for subsequent analysis. The circuits sample the voltages frequently enough to ensure capture of the $0^{th}$ droop event.

The voltage droop detector architecture described herein, in contrast to the prior art, exploits a semi-synchronous continuous digital sampling technique to identify and record $0^{th}$ droop events. Prior art droop detectors are generally analog solutions whose speed limitations render them incapable of capturing the $0^{th}$ droop event.

In the following detailed description, reference is made to the accompanying drawings, which show by way of illustration specific embodiments in which the invention may be practiced. However, it is to be understood that other embodiments will become apparent to those of ordinary skill in the art upon reading this disclosure. The following detailed description is, therefore, not to be construed in a limiting sense, as the scope of the present invention is defined by the claims.

Figure 1:
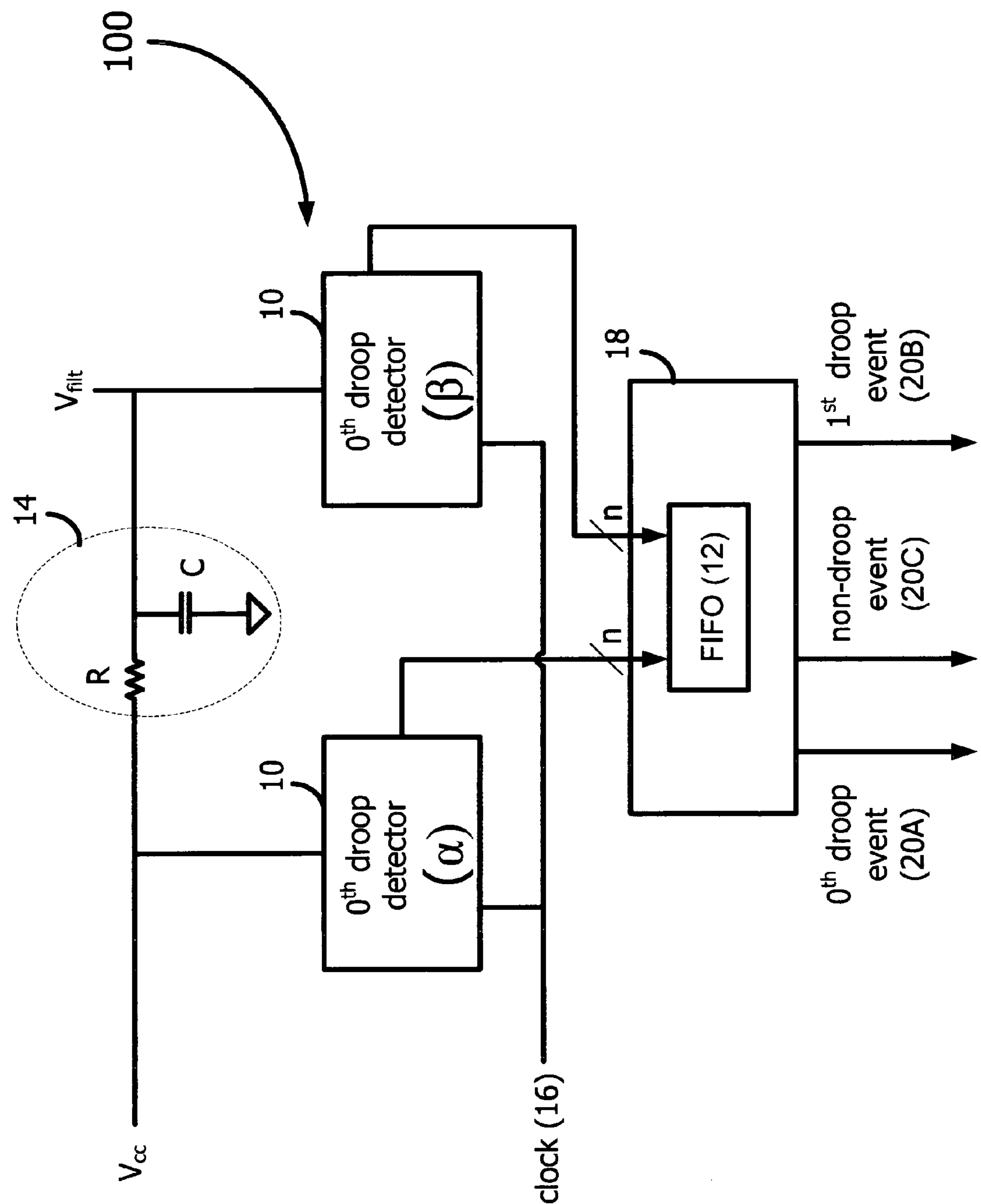
FIG. 1 is a schematic diagram of a voltage droop detection circuit, according to some embodiments.

FIG. 1 is a schematic diagram of a voltage droop detector 100, according to some embodiments. Two high-speed droop detectors 10, designated α (hereinafter, α droop detector) and β (hereinafter, β droop detector), a filter 14, a combinational logic circuit 18, and a first-in-first-out (FIFO) circuit 12 are shown. The droop detectors 10 are controlled by a clock 16, which may be the clock for the load or another clock. The filter 14 is a simple RC filter, comprising a resistor R and a capacitor C. The voltage droop detector 100 is able to identify a $0^{th}$ droop event 20A, a $1^{st}$ droop event 20B, or a non-droop event 20C.

In some embodiments, the a droop detector and the β droop detector are equivalent circuits. As used herein, the term "equivalent circuits" is meant to describe circuits which functionally operate in a like manner; although equivalent circuits may be designed using different logic components, their behavior during operation is substantially the same. Thus, while the a droop detector and the β droop detector may internally include different components, they function as though they are the same circuit.

The α droop detector receives a voltage $V_{cc}$, the voltage from the power grid of the load; the β droop detector receives a voltage $V_{filt}$. The voltage $V_{filt}$ is the result of the filter 14 smoothing out some of the voltage spikes from the power grid voltage $V_{cc}$, in particular, the $0^{th}$ droop voltage event. Thus, R and C of the filter 14 are selected so as to allow other voltage variations, such as $1^{st}$ droop, $2^{nd}$ droop, etc., to pass through to the β droop detector. Hereinafter, the load will be referred to as a microprocessor load, although the principles of the voltage droop detector 100 may be applied to virtually any load.

In some embodiments, the a droop detector and the β droop detector continuously sample the voltage from the power grid $V_{cc}$ and the filtered out voltage $V_{filt}$, respectively. Each droop detector 10 includes n sampling circuits, described FIG. 2 and succeeding figures, below. The droop detectors 10 thus each produce n outputs, one for each sampling circuit, which are fed into the optional memory buffer or FIFO 12, which stores the outputs of the droop detectors 10 for further analysis. The outputs of the droop detectors 10 include both droop events and non-droop events. (Where no FIFO 12 is present, the combinational logic circuit 18 analyzes the droop events as the results emerge from the droop detectors.) The combinational logic circuit 18 comprises combinational logic for distinguishing the $0^{th}$ droop event 20A, a $1^{st}$ droop event 20B, or a non-droop event 20C. In some embodiments, the combinational logic circuit 18 monitors the contents of the FIFO 12 and interrupts operation of the droop detectors when a droop event has been detected. System designers of ordinary skill recognize a number of implementations of the combinational logic circuit 18.

The FIFO 12 receives the sampling information obtained from the α and β droop detectors. The history around the events 20A, 20B, and 20C may be analyzed in detail a posteriori. The voltage droop detector 100 actually "detects" the $0^{th}$ droop event a posteriori to the event. Thus, the detector 100 has knowledge of the $0^{th}$ droop event 20A after the event is completed.

In some embodiments, the information received from the α and β droop detectors, including both droop events and non-droop events, is fed into the FIFO 12, which stores a predetermined number of samples. Once a droop event is identified by the combinational logic circuit 18, information continues to be stored in a first-in-first-out fashion until the droop event information is stored approximately in the middle of the FIFO (or at any chosen location in the FIFO, from the beginning to the end). This ensures that the FIFO 12 includes stored information that occurs prior to the droop event as well as information that occurs following the droop event. The voltage droop detector 100 is then stopped and the contents of the FIFO are transferred to another memory (not shown in FIG. 1) for further analysis. The other memory may be additional volatile memory, such as a dynamic random access memory (DRAM), non-volatile media, such as a hard disk drive or compact disk read-only memory (CDROM), or other storage device. Once the FIFO contents are transferred, the FIFO 12 may then be flushed, and the voltage droop detector 100 may be restarted for sampling the load voltage. In other embodiments, the process of transferring the FIFO contents to another memory may be performed automatically using software, hardware, or a combination thereof, enabling the voltage droop detector 100 to obtain sampling information about the load voltage continuously.

Figure 2:
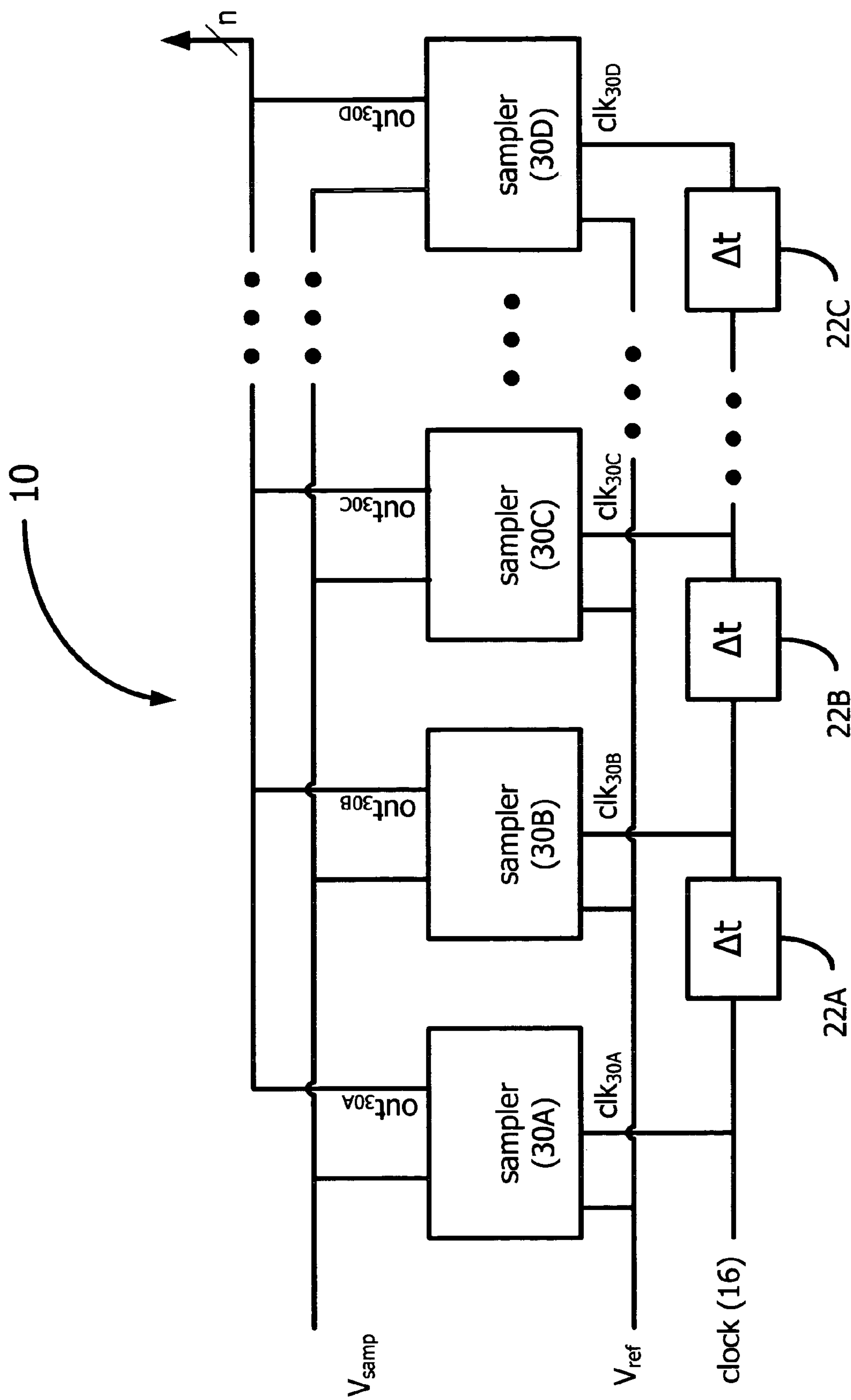
FIG. 2 is a schematic diagram of the $0^{th}$ droop detector 10 of FIG. 1, according to some embodiments.

FIG. 2 is a schematic diagram of the $0^{th}$ droop detector 10 of FIG. 1, according to some embodiments. The droop detector 10 may be either the α droop detector or the β droop detector, which are distinguished by their input voltage. The $0^{th}$ droop detector 10 receives a voltage, designated $V_{samp}$, which is either the power grid voltage $V_{cc}$ (a droop detector) or the filtered voltage $V_{filt}$ (β droop detector). The clock 16 is used to sample the voltage.

The $0^{th}$ droop detector 10 includes a row of n samplers, four of which are designated 30A, 30B, 30C, and 30D (collectively, samplers 30). N−1 delay circuits 22A, 22B, and 22C (collectively, delay circuits 22) are also depicted. The samplers 30 are triggered, one after the other, by the respective delay circuits 22. The delay circuits 22 include logic for delaying the clock 16 by a predetermined amount. The delay circuits 22 may comprise any of a number of logic elements, known to those of ordinary skill in the art. In some embodiments, the delay circuits 22 are equivalent circuits, thus providing equivalent delays between samples. The delay circuits 22 ensure that each sampler 30 receives the voltage $V_{samp}$ at a slightly different moment in time, specified as Δt.

In some embodiments, the sampler circuits 30A, 30B, 30C, and 30D are equivalent circuits. The sampler circuits receive clock inputs $clk_i$, where i is the reference number of the sampler. Except for the first sampler 30A, which receives the voltage $V_{samp}$ according to the clock 16, the remaining samplers 30 each receive the voltage $V_{samp}$ according to a different clock input, as specified by dedicated delay circuits 22. Where the clock 16 input is designated as to (and assuming the $0^{th}$ droop detector 10 includes four samplers), sampler 30A receives the voltage $V_{samp}$ at time t0 ($clk_{30A}$), sampler 30B receives the voltage $V_{samp}$ at time $t_0+\Delta t$ ($clk_{30B}$), sampler 30C receives the voltage $V_{samp}$ at time $t_0+2\Delta t$ ($clk_{30C}$), and sampler 30D receives the voltage $V_{samp}$ at time $t_0+3\Delta t$ ($clk_{30D}$). By sampling the voltage $V_{samp}$ with a short delay Δt, the voltage $V_{samp}$ is continuously observed even when the reference clock controlling the samplers (clock 16) is of a lower frequency than the droop event itself.

The time delay Δt specified by the delay circuits 22 may vary according to the frequency of the clock 16, the number of samples to be taken, or other considerations. The length of time it takes for each sampler 30 to complete the processing of a single sample is known as its sampling window. In some embodiments, the time delay Δt and the sampling window are equivalent in duration. Keeping the sampling window approximately equivalent to the time delay Δt ensures that all events are captured on the power grid of the load.

Each sampler 30 also receives a voltage $V_{ref}$ as an input. The voltage $V_{samp}$ is compared to the reference voltage $V_{ref}$, and an output outs is generated, one for each sampler 30. When the voltage $V_{samp}$ is below the voltage $V_{ref}$, the sampler 30 knows a droop event has occurred.

In some embodiments, digital information is obtained from each $0^{th}$ droop detector 10 (α and β). By combining the digital information obtained from the a droop detector 10A, which samples the voltage $V_{cc}$ of the power grid of the load, with the digital information obtained from the β droop detector 10B, which samples the filtered voltage $V_{filt}$ of the power grid, the voltage droop detector 100 is able to discriminate the very high-speed portion of a voltage droop ($0^{th}$ droop) from a slower voltage droop ($1^{st}$ droop, $2^{nd}$ droop, etc.) The β droop detector 10B samples out the filtered version of the power grid, and thus detects lower frequency components of the voltage droop, that is, not $0^{th}$ droop events. Thus, when both detectors (α and β) detect a droop event, the voltage droop detector 100 knows the event is not a pure $0^{th}$ droop event, but a lower frequency droop ($1^{st}$ droop and more). In some embodiments, the $0^{th}$ droop is identified when the a droop detector, which is directly sampling the power grid of the load, detects a droop. In this manner, the combinational logic 18 of the voltage droop detector 100 filters the n events from each of the droop detectors 10 to obtain the $0^{th}$ droop event.

Figure 3:
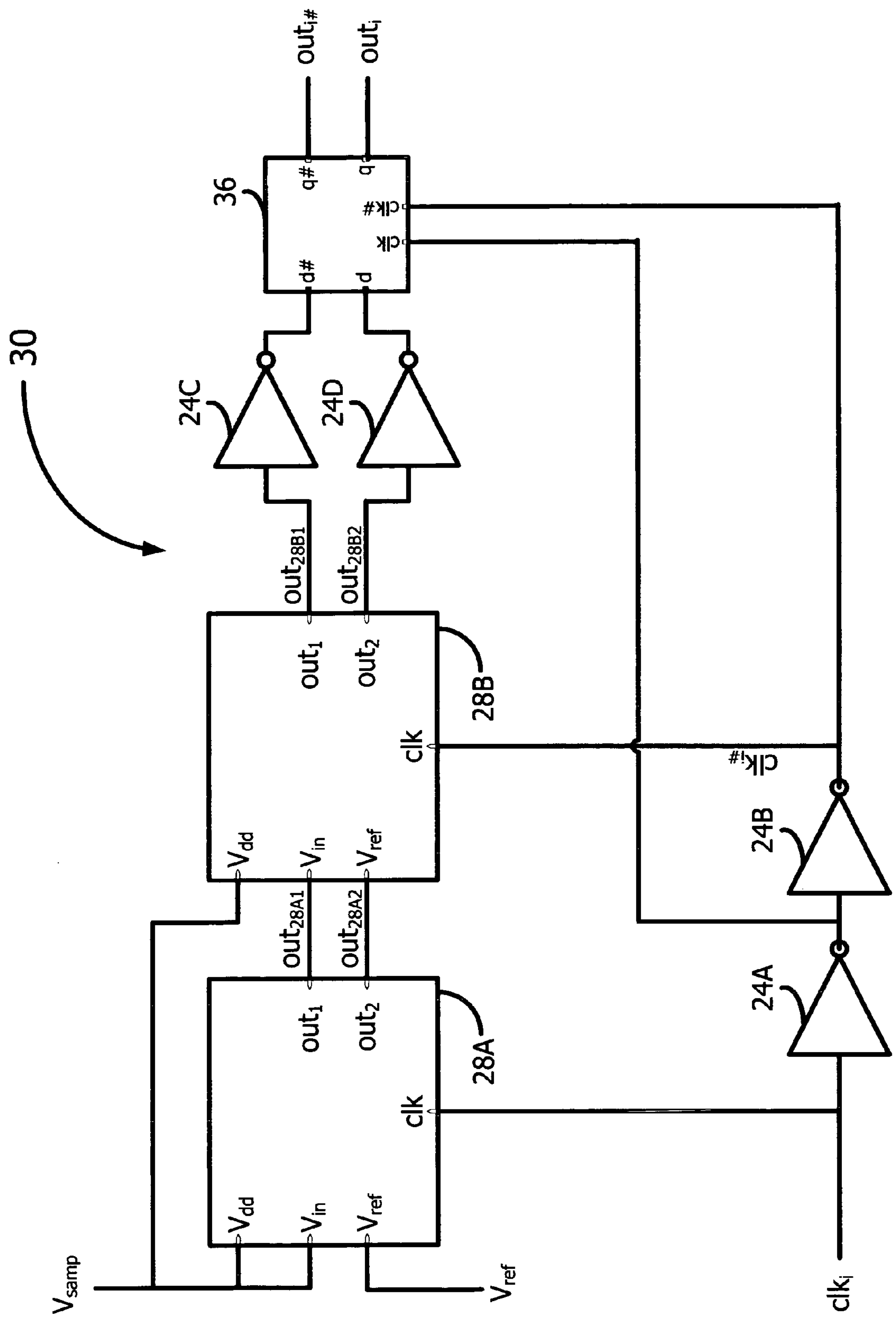
FIG. 3 is a schematic diagram of the sampler circuit of FIG. 2, according to some embodiments.

FIG. 3 is a schematic diagram of the sampler circuit 30 of FIG. 2, according to some embodiments. As indicated, above, each of the sampler circuits depicted in FIG. 2 is an equivalent circuit. The representation of FIG. 3 is thus repeated for n sampler circuits in the $0^{th}$ droop detector 10 of FIG. 2; since there are two $0^{th}$ droop detectors 10 in the voltage droop detector 100 of FIG. 1, the sampler circuit 30 of FIG. 3 is thus present 2n times in the voltage droop detector 100.

Figure 4:
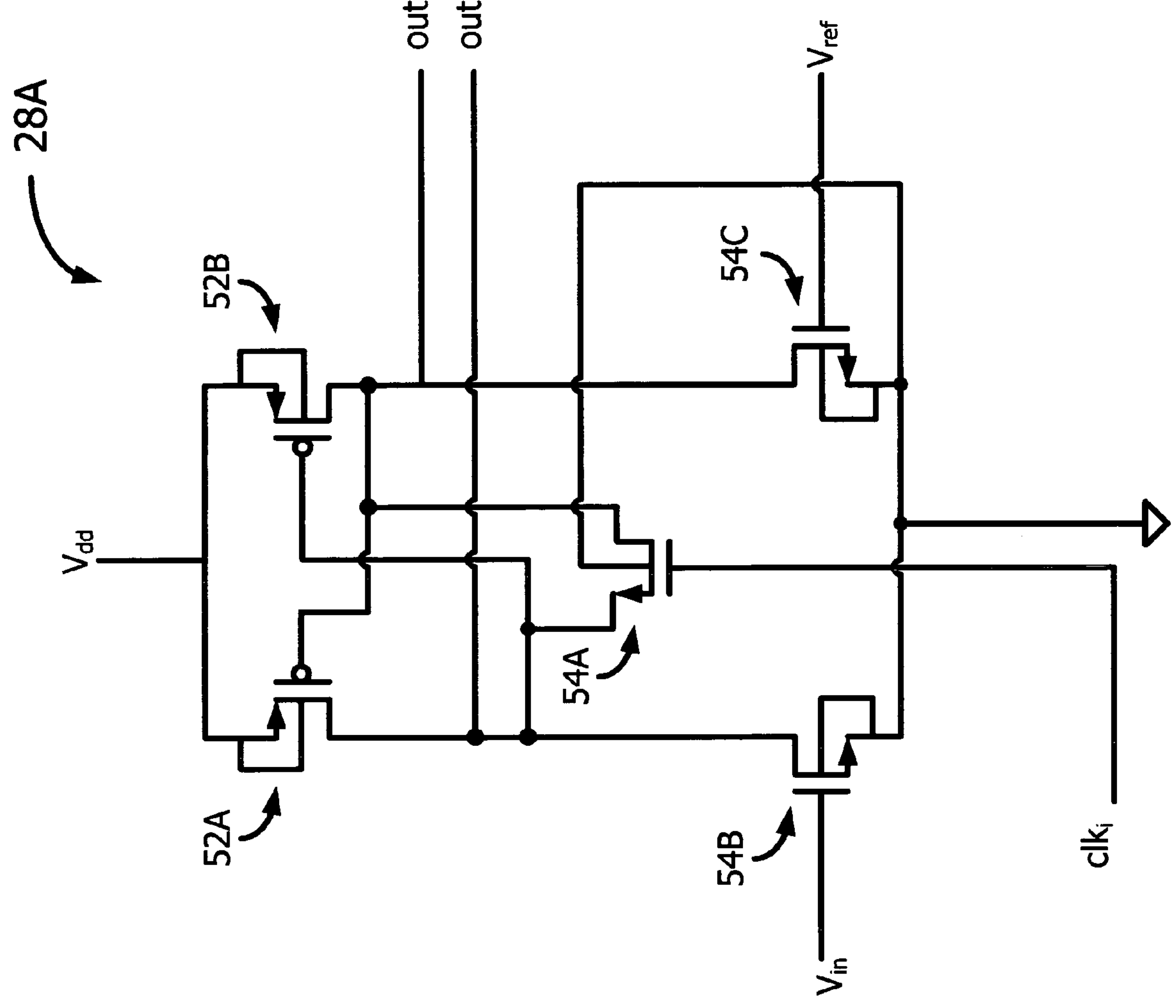
FIG. 4 is a circuit diagram of the sampler stage 28A of FIG. 3, according to some embodiments.
Figure 5:
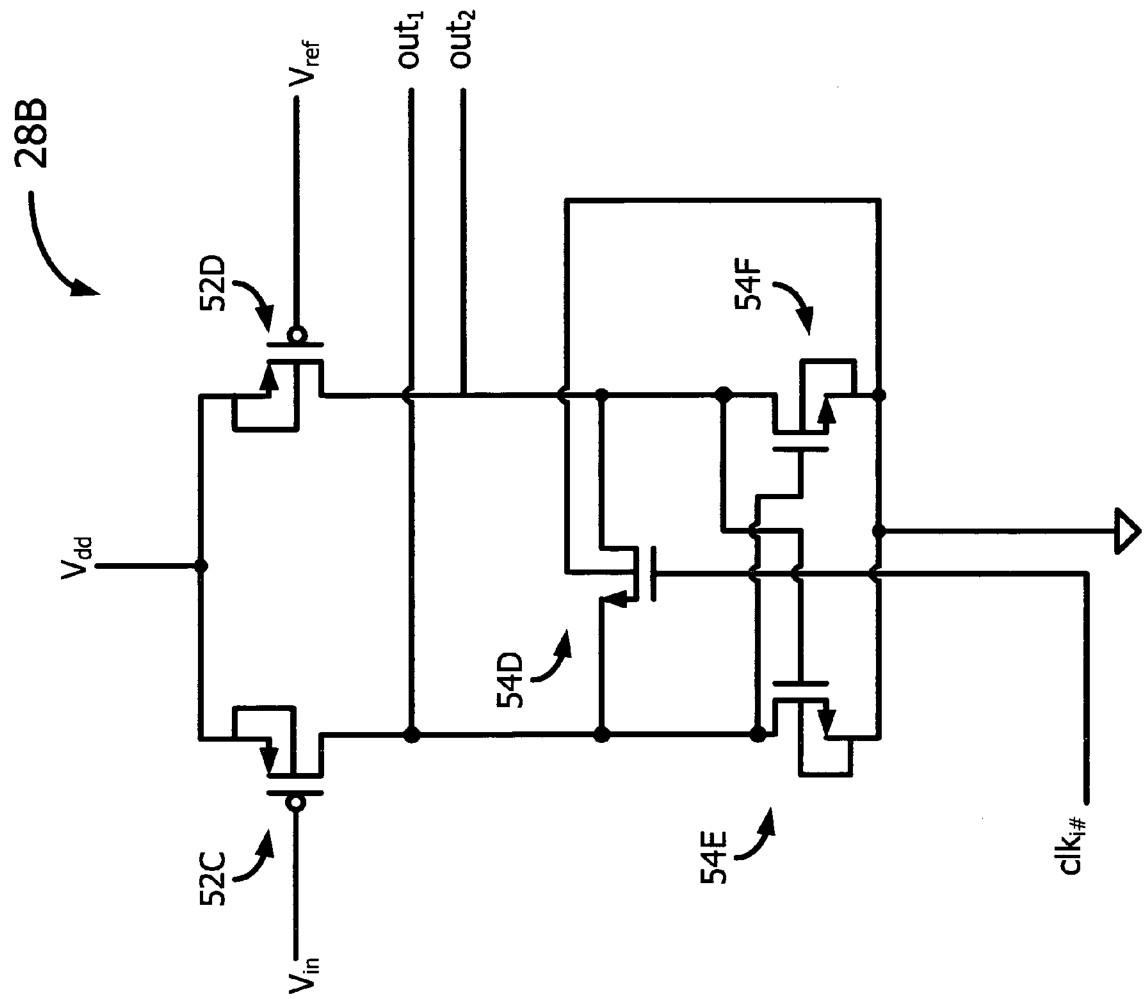
FIG. 5 is a circuit diagram of the sampler stage 28B of FIG. 3, according to some embodiments.

The sampler 30 includes two circuits, 28A and 28B, the sampling circuits. An implementation of the sampling circuit 28A is depicted in FIG. 4, while an implementation of the sampling circuit 28B is depicted in FIG. 5, below.

The circuit 28A receives three voltage inputs, $V_{dd}$, $V_{in}$, and $V_{ref}$, two of which are tied together ($V_{dd}$ and $V_{in}$), as well as clock input $clk_i$ which varies according to the relevant sampler circuit (i.e., $clk_{30A}$ for sampler 30A, $clk_{30B}$ for sampler 30B, etc.). The circuit 28A produces two complementary output signals, $out_{28A1}$ and $out_{28A2}$, which are received into the circuit 28B as $V_{in}$ and $V_{ref}$, respectively.

Two inverters 24A and 24B are coupled to the clock input $clk_i$. These inverters produce clock, $clk_{i\#\#}$, a clock with a small delay relative to the clock $clk_i$. The clock $clk_{i\#\#}$ is used to clock the circuit 28B. Again, the clock input $clk_{i\#\#}$ to the circuit 28B varies according to the relevant sampler circuit in which the circuit resides (i.e., $clk_{30A\#\#}$ for sampler 30A, $clk_{30B\#\#}$ for sampler 30B, etc.). The circuit 28B produces two complementary output signals, $out_{28B1}$ and $out_{28B2}$, which are received into inverters 24D and 24C, respectively. The inverted $out_{28B1}$ and $out_{28B2}$ signals are then fed into a flip-flop 36, resulting in signals $out_{i\#}$ and $out_i$, respectively, where i is one of the sampler designations (e.g., 30A). Thus, for sampler 30A, the complementary outputs $out_{30A}$ and $out_{30A\#}$ are produced. The output $out_{30A}$ is fed into the combinational logic 18 (FIG. 1).

As shown in FIG. 3, the first stage (circuit 28A) is triggered by the clock input ($clk_i$) and the second stage (circuit 28B) is triggered two inverter delays (24A and 24B) later by the clock input ($clk_{i\#}$). The result of the sampling is captured by the flip-flop 26, as the complementary $out_{i\#}$ and $out_i$ signals.

Figure 6:
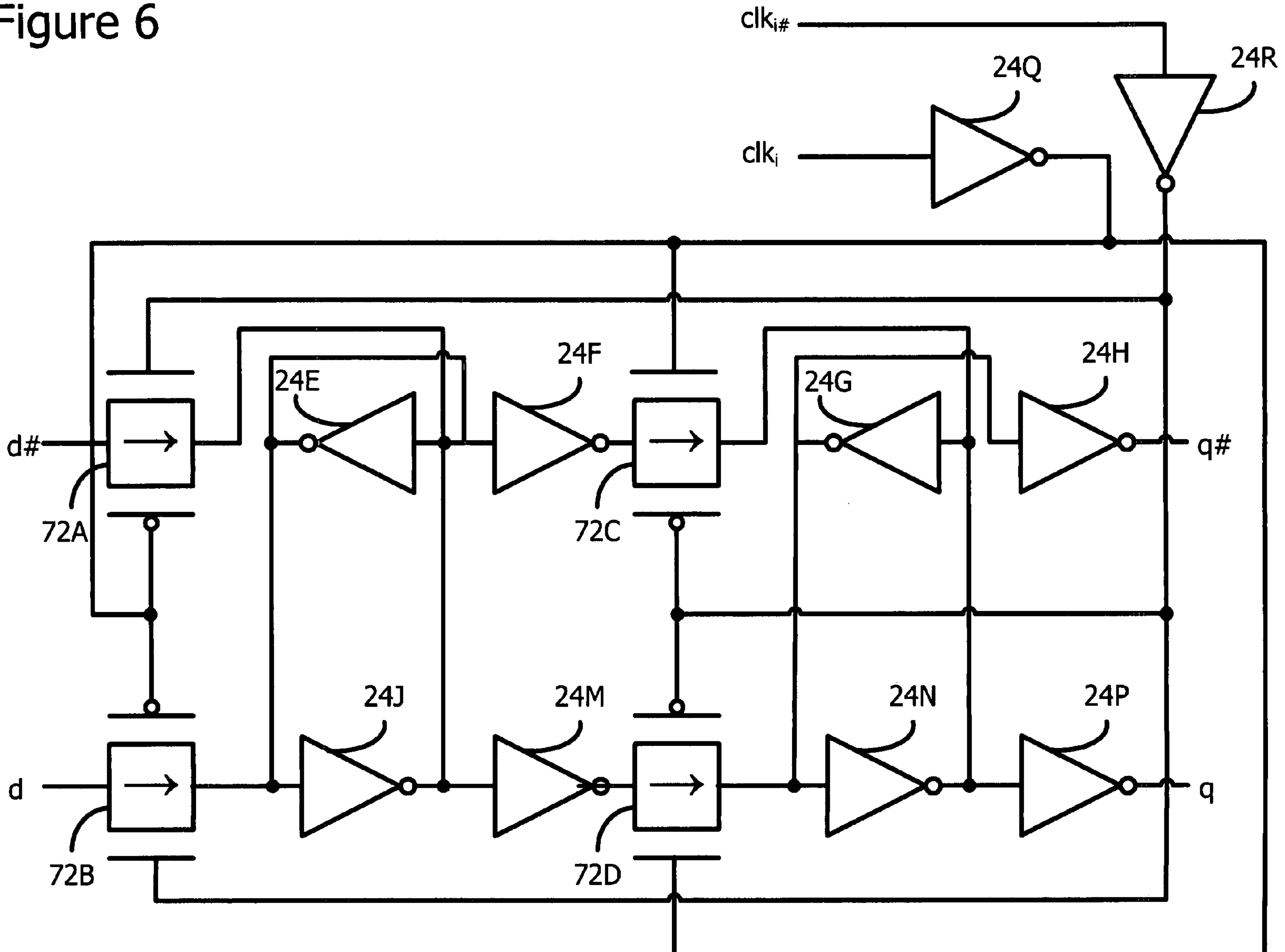
FIG. 6 is a circuit diagram of the flip-flop 36 of FIG. 3, according to some embodiments.

FIGS. 4, 5, and 6 depict implementations of the sampling circuit 28A, the sampling circuit 28B, and the flip-flop 36, respectively, according to some embodiments. Looking at FIGS. 4 and 5 together, the sampling circuits 28A and 28B are complementary, and include both p-type metal oxide semiconductor (PMOS) and n-type MOS (NMOS) transistors. The sampling circuit 28A (FIG. 4) includes two PMOS transistors, 52A and 52B, and three NMOS transistors 54A, 54B, and 54C. The sampling circuit 28B (FIG. 5) also includes two PMOS transistors, 52C and 52D, and three NMOS transistors 54D, 54E, and 54F.

The NMOS transistor 54A is controlled by the clock signal $clk_i$ (FIG. 4) while the NMOS transistor 54D is controlled by the delayed clock signal $clk_{i\#\#}$ (FIG. 5). The transistors 54A and 54D reset the respective sampling circuits 28A and 28B before the sampling occurs.

In the sampling circuit 28A (FIG. 4), $V_{in}$ is tied to the gate of NMOS transistor 54B while $V_{ref}$ is tied to the gate of NMOS transistor 54C. $V_{dd}$ (which is sampling voltage $V_{samp}$—see FIGS. 2 and 3) is tied to the sources of the PMOS transistors 52A and 52B. The PMOS transistors 52A and 52B are cross-coupled; that is, the input of one is connected to the output of the other, and vice-versa.

The sampling circuit 28B samples the outputs from the circuit 28A. In the sampling circuit 28B (FIG. 5), $V_{in}$ (output $out_{28A1}$ from the sampling circuit 28A) is tied to the gate of the PMOS transistor 52C while $V_{ref}$ (output $out_{28A2}$ from the sampling circuit 28A) is tied to the gate of the PMOS transistor 52D. $V_{dd}$ ($V_{samp}$) is tied to the sources of the PMOS transistors 52C and 52D. The drains of the PMOS transistor 52C and the NMOS transistor 54E are tied to the output $out_1$; the drains of the PMOS transistor 52D and the NMOS transistor 54F are tied to the output $out_2$. The NMOS transistors 54E and 54F are cross-coupled; the input of one is connected to the output of the other, and vice-versa. In some embodiments, the sampling window is about 30 ps.

Referring back to FIG. 3, the results of the sequentially arranged sampling circuits 28A and 28B are fed into the inverters 24C and 24D, the output of which are then fed into the flip-flop 36. An implementation of the flip-flop 36 is depicted in FIG. 6, according to some embodiments. Flip-flop or master-slave latches are well-known logic circuits; system designers of ordinary skill in the art will recognize that the flip-flop 36 may be replaced by any of a number of latch circuits. The flip-flop 36 is used to capture the output of the second sampling stage. The output of the sampling stage is a differential signal ($out_{28B1}$ and $out_{28B2}$); likewise, the output of the flip-flop 36 (q# and q) is a differential signal ($out_{i\#}$ and $out_i$). The flip-flop 36 includes pass-gate circuits 72A, 72B, 72C, and 72D and inverters 24E, 24F, 24G, 24H, 24J, 24M, 24N, 24P, 24Q, and 24R.

Returning to FIG. 3, once the flip-flop 36 produces the output ($out_{i\#}$, $out_i$), the output outs, along outputs from the n samplers (FIG. 2). Thus, where the $0^{th}$ droop detector 10 in FIG. 2 includes four samplers, outputs $out_{30A}$, $out_{30B}$, $out_{30C}$, and $out_{30D}$, or four outputs, are generated. These four outputs from one of the $0^{th}$ droop detectors (say, the a droop detector) are then fed into the combinational logic circuit 18 (FIG. 1), along with four outputs from the from the other $0^{th}$ droop detector (say, the β droop detector). Recall that the combinational logic circuit 18 isolates $0^{th}$ droop events by identifying sampled outputs stored in the FIFO 12 that were specified by the a droop detector as droop events but not specified by the β droop detector as droop events. As shown in FIG. 1, the combinational logic circuit 18 generates the $0^{th}$ droop event 20A, $1^{st}$ droop event 20B, and non-droop event 20C as outputs. The FIFO 12 may be large enough to hold multiple droop events, for later processing.

The FIFO 12 thus may store a continuous record of sampling information from the droop detectors 10. The FIFO 12 may be part of the voltage droop detector 100 or may be a separate device connectable directly to the combinational logic 18. Where the voltage droop detector 100 continuously samples the power grid of a load, such as a microprocessor, the FIFO 12 stores a record of the status of each sampling during each cycle of the reference clock 16, including $0^{th}$ droop events. This information may be compared to other stored information about the load operation, such as CPU cycles for a microprocessor, in order to ascertain the source of the $0^{th}$ droop event. The information stored in the FIFO 12 may be retained indefinitely.

Figure 7:
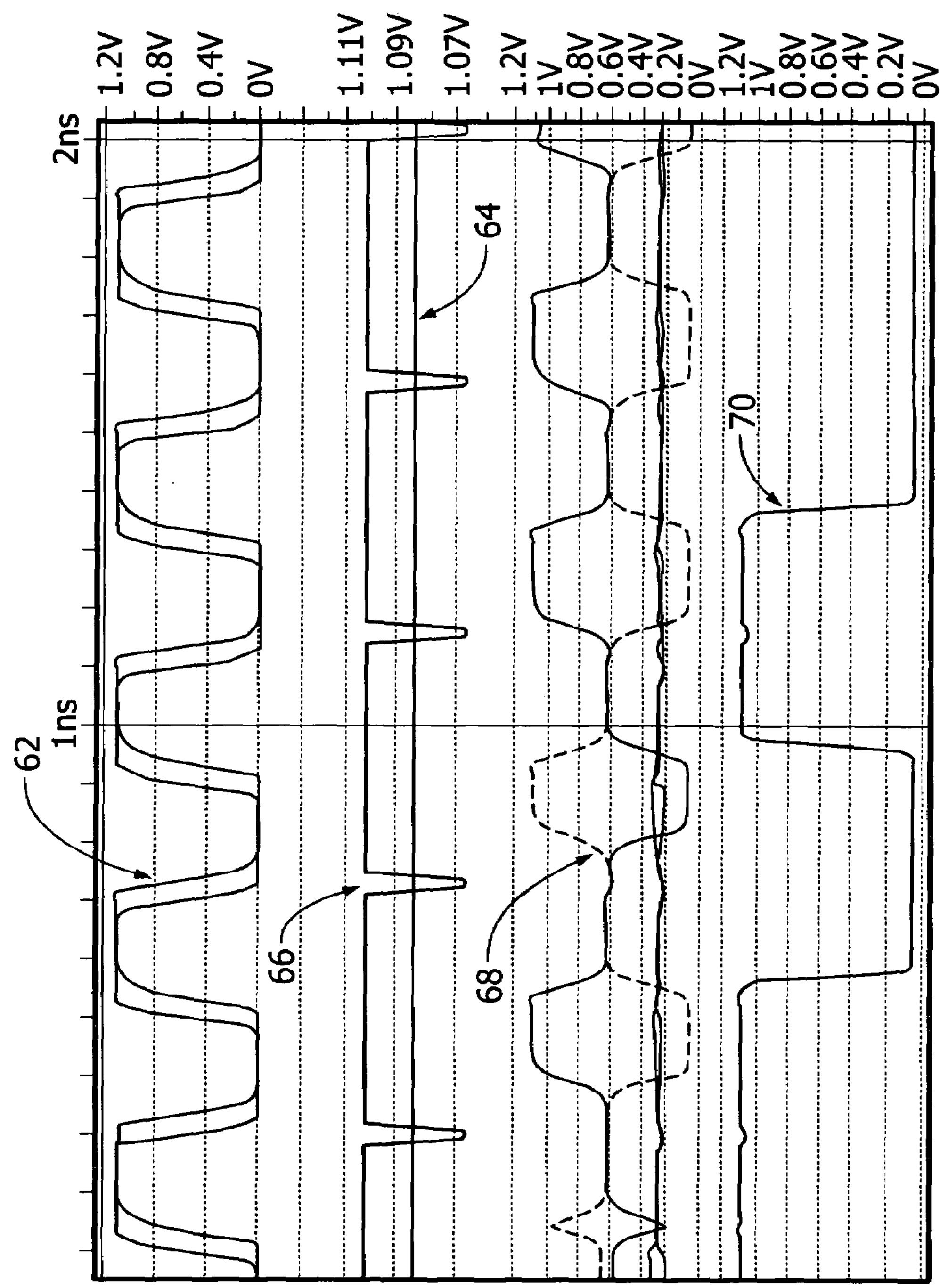
FIG. 7 is a timing diagram showing a $0^{th}$ droop detection by the circuit of FIG. 1, according to some embodiments.

In FIG. 7, a timing diagram showing the results of the $0^{th}$ droop detector 10A (the a droop detector) of FIG. 1 in the presence of a 30 mV droop event on a 1.1V supply. The following identifying features are denoted: sampling clocks 62, droop event 66, sampler switching 68, and flip-flop capture of the event 70. A droop reference voltage 64 is set to 15 mV below 1.1V. The sampling clock 62 is actually two clocks, $clk_i$ and $clk_{i\#\#}$, with a slight time delay between the two, as described above. The droop event 66 is very short, 30 mV in amplitude and 20 ps in duration. The output of the sampler switching in the opposite direction than in absence of droop 68 are two complementary traces. One trace is the output from the sampler ($out_i$) and the other trace is its complement ($out_{i\#}$). As indicated by the arrow 68, the previously low-going trace is going up while the previously high-going trace is going down. The droop event 66 is captured by the sampler generating the output signal 68, itself captured by the flip-flop 12, as shown by the flip-flop output signal 70, which holds the captured state for one full clock period.

Compared to droop detectors available in the prior art, the voltage droop detector 100 offers performances up to fifty times faster in terms of droop bandwidth detection, according to some embodiments. Each sampler 30 in the $0^{th}$ droop detector 10 has a sampling window that is longer than the droop event itself (for a typical $0^{th}$ droop event). In contrast, prior art droop detectors are based on asynchronous analog solutions which compare, in continuous time, the droop observed on the power grid to a reference droop voltage and amplifying this difference until it becomes large enough to trigger an event detector. Such prior art droop detectors rely on asynchronous differential operational amplifier structures, and are limited by the bandwidth of the differential amplifier (i.e. a few GHz at most). The limited bandwidth means that these droop detectors are capable of detecting a $1^{st}$ droop, at best.

Advantageously, the voltage droop detector 100 overcomes the concern that the monitored droop event is unpredictable by guaranteeing that the power grid of the load is sampled continuously and systematically, as described above, ensuring that one of the samplers 30 captures the droop event. In some embodiments, the number of samplers 30 used in each $0^{th}$ droop detector 10 ($\alpha$ or $\beta$) is proportional to the frequency of the reference clock used (clock 16 in FIG. 1) and to the duration of the sampling window. Preferably, the delay between the triggering of two samplers 30 ($\Delta t$) is equivalent to the sampling window of the samplers 30. In some embodiments, the number of samplers 30 is at least equal to the period of the reference clock (clock 16) divided by the sampling window (which is equal to the delay element $\Delta t$, in some embodiments). One way to guarantee that the clock period matches the number of samplers 30 multiplied by the delay $\Delta t$ between two samplers 30 is to generate the clock directly from the chaining of the delay elements 22 (FIG. 2).

The fact that the voltage droop detector 100 potentially determines that a voltage droop event has happened after the droop event has ended is not a cause for concern. The outputs of the samplers 30 are stored digitally in the FIFO 12 and are available for examination a posteriori. Thus, a second advantage of the voltage droop detector 100 over the prior art is its ability to indefinitely store historical information about droop events to the load.

The historical information is available in digital format and is thus available for analysis at any time. The information in the FIFO 12 may be exploited to look for a specific type of event. For example, the sampling of the voltage droop detector 100 may be interrupted when a specific droop profile has been stored in the FIFO 12.

For a microprocessor loads in particular, because the voltage droop on the power grid directly affects its performance, being able to monitor the $0^{th}$ droop event, $1^{st}$ droop event, and so on, as accurately as possible provides a system designer the ability to address the consequent problems resulting from the droop events. Circuits which compensate for the effect of power grid resonance and $1^{st}$ droop events are currently available. Such circuits may be modified to compensate for $0^{th}$ droop events as well. An accurate record of the droop event will enable such circuits to be effective. The voltage droop detector 100 described above is capable of providing such accurate records.

Figure 8:
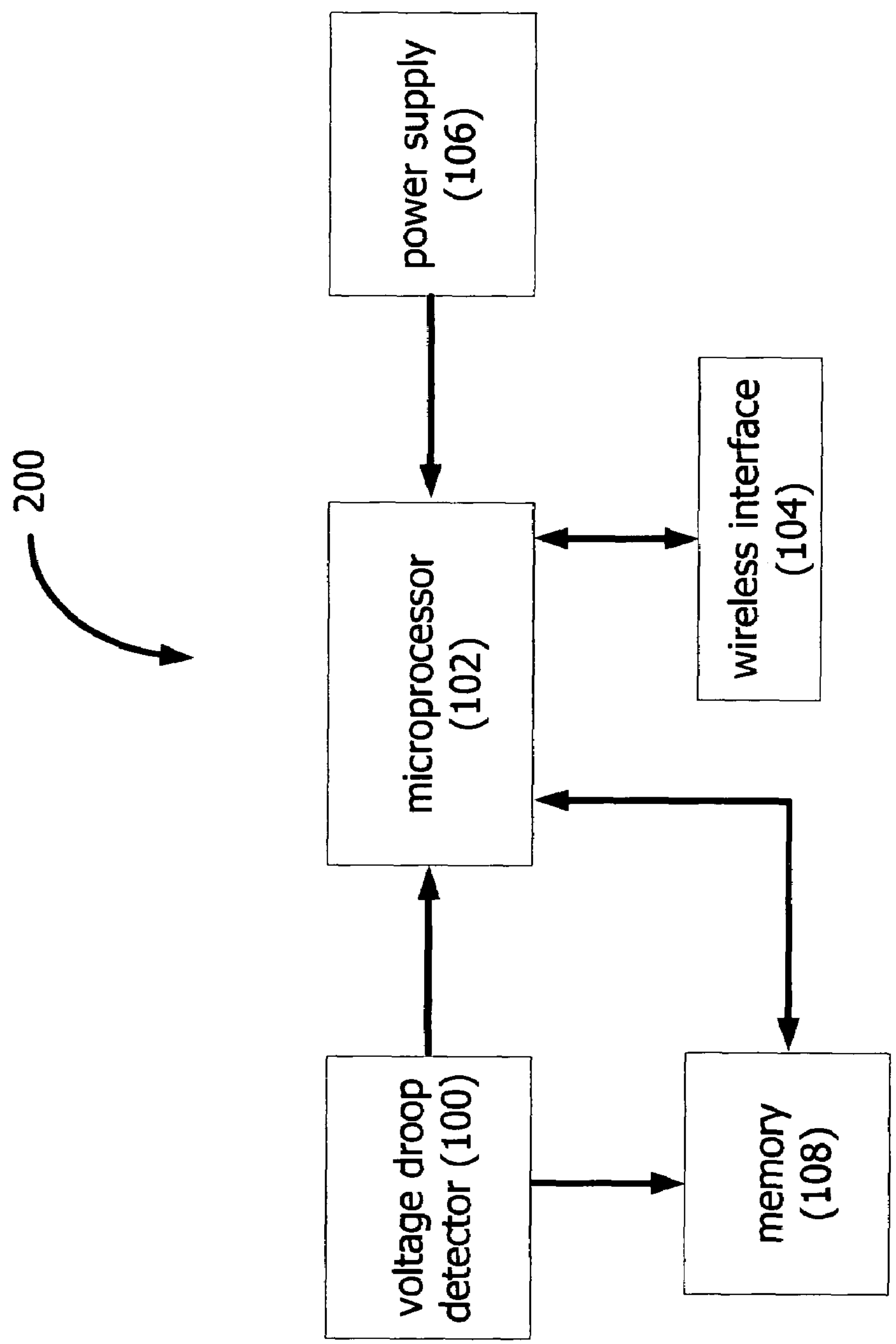
FIG. 8 is a block diagram of a system including the voltage droop detector of FIG. 1, according to some embodiments.

In FIG. 8, a system 200 for implementing the voltage droop detector 100 of FIG. 1 is depicted, according to some embodiments. The system 200 generally comprises a microprocessor 102 coupled to the voltage droop detector 100, a wireless interface 104, a power supply 106, and a memory 108. The microprocessor 102 is coupled to the voltage droop detector 100, power supply 106, wireless interface 104 and memory 108 using separate point-to-point links. (Alternatively, the microprocessor 102 may be coupled to the devices via a bus interface.) The wireless interface 104, which includes an antenna, couples the microprocessor 102 to a client or to a network. The power supply 106 supplies power to the microprocessor 102 during operation of the system 200. The voltage droop detector 100 detects $0^{th}$ droop, $1^{st}$ droop, and non-droop events occurring due to changes in the microprocessor load, as discussed herein. Droop and non-droop events obtained during voltage sampling may periodically be stored in the memory 108, as described above, for subsequent analysis.

While the invention has been described with respect to a limited number of embodiments, those skilled in the art will appreciate numerous modifications and variations therefrom. It is intended that the appended claims cover all such modifications and variations as fall within the true spirit and scope of the invention.

We claim:

1. A circuit, comprising:

a first detector to sample a first voltage from a load, wherein the first detector produces a first detector signal; and a second detector to sample a second voltage from the load, where in the second voltage results from the first voltage being modified by a filter, the second detector producing a second detector signal;

wherein a $0^{th}$ droop event is indicated in response to the first detector signal identifying a droop event and the second detector signal identifying a non-droop event.

2. The circuit of claim 1, further comprising:

combinatorial logic to receive the first detector signal and the second detector signal, wherein the combinatorial logic identifies the $0^{th}$ droop event.

3. The circuit of claim 1, further comprising:

a memory buffer to store the first signal and the second signal such that the signals are stored for later analysis.

4. The circuit of claim 2, wherein the memory buffer is a first-in-first-out circuit.

5. The circuit of claim 1, further comprising:

a reference clock, the reference clock being used by both the first detector and the second detector.

6. The circuit of claim 4, the first detector further comprising:

a number of sampler circuits, each sampler circuit receiving a sampling voltage and a reference voltage; and a second number of delay circuits, the second number being one less than the number, wherein the delay circuits are disposed in the voltage droop detector such that each of the sampler circuits receives a different clock input.

7. The circuit of claim 5, wherein the sampling voltage to the first detector is the first voltage.

8. The circuit of claim 5, the second detector being an equivalent circuit to the first detector, wherein the sampling voltage to the second detector is the second voltage.

9. The circuit of claim 5, each of the number of sampler circuits further comprising:

a first circuit comprising a plurality of transistors, wherein the first circuit receives the sampling voltage and the reference voltage and produces a first output and a second output;

a second circuit comprising a second plurality of transistors, wherein the second circuit receives the first output and the second output and produces a third output and a fourth output; and a flip-flop comprising a plurality of inverters and pass-gate circuits, wherein the flip-flop receives an inverted third output and an inverted fourth output and produces a fifth output and a sixth output.

10. The circuit of claim 8, wherein the first plurality of transistors and the second plurality of transistors each comprise two p-type metal oxide semiconductor transistors and three n-type metal oxide semiconductor transistors.

11. The circuit of claim 5, wherein each of the sampler circuits is processed in a first time period and each of the delay circuits is processed in a second time period, wherein the first time period is substantially similar to the second time period.

* * * * *